United States Patent
Zhong et al.

[11] Patent Number: 6,005,429
[45] Date of Patent: Dec. 21, 1999

[54] $I_{CC}$ CURRENT ELECTROMAGNETIC INTERFERENCE CHOKE WITH MULTIPLE CHOKING LEVELS

[75] Inventors: Freeman Zhong, Fremont; William E. Miller, Los Gatos, both of Calif.

[73] Assignee: National Semiconductor Corporation, Santa Clara, Calif.

[21] Appl. No.: 09/118,283

[22] Filed: Jul. 17, 1998

[51] Int. Cl.$^6$ ........................................ H03K 5/14
[52] U.S. Cl. ............................ 327/270; 327/276
[58] Field of Search .................... 327/384, 551, 327/269, 270, 272, 276, 277, 278, 281; 375/200

[56] References Cited

U.S. PATENT DOCUMENTS

| | | | |
|---|---|---|---|
| 5,317,207 | 5/1994 | Mortensen | 327/384 |
| 5,422,919 | 6/1995 | Graham | 375/200 |
| 5,444,402 | 8/1995 | McMahon et al. | 327/170 |
| 5,561,792 | 10/1996 | Ganapathy | 395/550 |
| 5,650,739 | 7/1997 | Hui et al. | 327/270 |
| 5,675,832 | 10/1997 | Ikami et al. | 395/835 |

*Primary Examiner*—Tuan T. Lam
*Attorney, Agent, or Firm*—Limbach & Limbach, L.L.P.

[57] ABSTRACT

An apparatus for and method of reducing electromagnetic interference of an integrated circuit by providing multiple choking levels are disclosed. A choking circuit includes a choking level select signal generator, a pulse choking circuit connected to the choking level select signal generator, and a modulation control circuit connected to the pulse choking circuit. The choking level is increased when modules of the integrated circuit are less active, which reduces electromagnetic interference. The choking level is decreased when modules of the integrated circuit are more active, which maintains the voltage supplied to the power bus above a desired level.

13 Claims, 7 Drawing Sheets

$I_{CC}$ CURRENT ELECTROMAGNETIC INTERFERENCE CHOKE WITH MULTIPLE CHOKING LEVELS

BACKGROUND OF THE INVENTION

1. Field of the Invention

The present invention relates to semiconductor integrated circuits having a circuit that reduces electromagnetic emissions generated by power supply current without degrading circuit performance. In particular, the invention relates to a choking circuit which has multiple levels of current smoothing.

2. Description of the Related Art

Modern electronic systems often include many integrated circuits, and the rapid switching of many thousands of logic elements causes electromagnetic emissions. Such emissions, when transmitted along power bus conductors, can interfere with the operation of the electronic system. Electromagnetic emissions may also interfere with the operation of nearby electrical equipment due to electric and magnetic fields radiated into space. This is the general problem of electromagnetic interference ("EMI").

In an integrated circuit, emissions are typically generated by the large numbers of transistors that switch in response to a transition of an input clock signal. Such simultaneous switching of the transistors generates high amplitude transient current pulses that must be provided by an external power supply. It is these transient pulses that cause most of the electromagnetic emissions generated by integrated circuits. On the other hand, a highly integrated circuit, such as a system-on-chip, consists of many modularized elements, but not all these elements are enabled simultaneously. Typically, only part of the elements are enabled to perform certain functions at a specific time. Therefore, the current of an integrated circuit drawn from an external power supply depends on the activities of the integrated circuit.

Inventors have proposed a number of solutions to reduce EMI. For example, U.S. Pat. No. 5,561,792 teaches that EMI may be lowered by selecting a lower clock frequency. U.S. Pat. No. 5,422,919 discloses that a pseudorandom code may be added to a digital signal to reduce its EMI. U.S. Pat. No. 5,675,832 teaches that a delay may be added to a signal to lower its EMI.

Another solution (for example, U.S. Pat. No. 5,317,207) has attempted to reduce the generation of electromagnetic emissions by choking the power supply current at every transition of a clock signal so that the amplitude of the transient pulse can be reduced and the pulse energy can be spread over an extended period of time. This reduction is made possible by dynamically modulating the resistive portion of a low pass filter between the external power supply and the power bus of the integrated circuit. Just prior to every transition of the clock signal in the integrated circuit's nucleus logic, the resistive portion of the low pass filter is increased to given value, termed a "choking level", and is then gradually reduced. In response to this resistance modulation, the voltage level on the internal nucleus power bus is necessarily reduced. In this patent, the way of modulating the resistive portion of the lower pass filter is the same at every transition of the clock signal, regardless the activities of the integrated circuit. Hence, it can be referred to as an $I_{cc}$ current EMI choke with a single choking level.

For the $I_{cc}$ current EMI choke with a single choking level, the choking level is chosen based on a high activity case of the integrated circuit, that is, when all modularized elements of the integrated circuit are active simultaneously, so that the voltage level on the internal nucleus power bus is not reduced below the level required in the most sensitive circuit operation. On the other hand, this choking level can be too little to reduce EMI efficiently in a case when only part of the modularized elements of an integrated circuit are active, which is the typical case most of the time for a highly integrated circuit.

SUMMARY OF THE INVENTION

The present invention addresses these and other problems of the prior art by introducing multiple choking levels in the $I_{cc}$ current EMI choke device. The choking level to the $I_{cc}$ depends on the activities of an integrated circuit. The higher the activities of the integrated circuit, especially in the $V_{cc}$ sensitive areas, the lower the choking level. The lower the activities of the integrated circuit, the higher the choking level. In this manner, the $I_{cc}$ current EMI can be reduced more efficiently and the voltage level on the internal nucleus power bus is maintained over critical cases of activities.

In addition, the multiple choking levels allow a lower power supply voltage to power the integrated circuit because the voltage drop caused by the choking circuit is less than with a single choking level.

According to one embodiment, an apparatus according to the present invention includes a choking circuit for reducing electromagnetic interference generated by an integrated circuit having a plurality of modules powered from a power bus. The choking circuit includes a choking level select signal generator, a pulse choking circuit connected to the choking level select signal generator, and a modulation control circuit connected to the pulse choking circuit. The choking level select signal generator is configured to receive a module select signal corresponding to selective activation of the modules, and to generate a choking level select signal corresponding to the module select signal. The pulse choking circuit is configured to receive the choking level select signal, a modulation control signal, and power from a power supply. The pulse choking circuit is further configured to selectively generate, on the power bus, choked power corresponding to the choking level select signal, when indicated by the modulation control signal. The modulation control circuit is configured to receive a clock signal and to generate the modulation control signal corresponding to the clock signal.

According to another embodiment, a method according to the present invention reduces electromagnetic interference generated by an integrated circuit having a plurality of modules powered from a power bus. The method includes the steps of receiving a module select signal corresponding to selective activation of the modules, generating a choking level select signal corresponding to the module select signal, and receiving the choking level select signal, a clock signal, and power from a power supply. The method further includes the steps of generating a modulation control signal corresponding to the clock signal, receiving the modulation control signal, and generating, on the power bus, choked power corresponding to the choking level select signal, when indicated by the modulation control signal.

DETAILED DESCRIPTION OF THE PREFERRED EMBODIMENTS

Overview of the Preferred Embodiments

The present invention more efficiently reduces the generation of electromagnetic emissions by reducing the amplitude of the transient pulse and by spreading pulse energy over an extended period of time based on the dynamic activities of an integrated circuit. This more efficient reduction is made possible by dynamically modulating the resistor portion of a low pass filter between the external power supply and the internal nucleus power bus of an integrated circuit, where the modulation of the resistor portion is in response to the dynamic activities of the integrated circuit. The higher the activities of the integrated circuit, the lower the maximum resistance of the resistor portion of the low pass filter during the resistance modulation. The lower the activities of an integrated circuit, the higher the maximum resistance of the resistor portion of the low pass filter during the resistance modulation. The set of these maximum resistances of the resistor portion of the low pass filter during the resistance modulation is referred to as a set of choking levels for an integrated circuit.

In a highly integrated circuit, especially a microcontroller with many peripheral elements, only part of the modularized elements are active most of time. The $I_{cc}$ current EMI choke with multiple choking levels can reduce more electromagnetic emissions and guarantee that the voltage level on the internal nucleus power bus is approximately the same over all cases of activities of an integrated circuit, which is required for the proper operation of an integrated circuit.

The number of choking levels depends on the particular integrated circuit. The integrated circuit is modularized into a number of modules, and the power budget for each module is estimated. Based on these power budgets, the number of the choking level can be determined for the integrated circuit. Each module is enabled by a module select signal. These module select signals can be used to generate the choking level select signal with a choking level select signal generator.

General Description of the Preferred Embodiments

Figure 1:
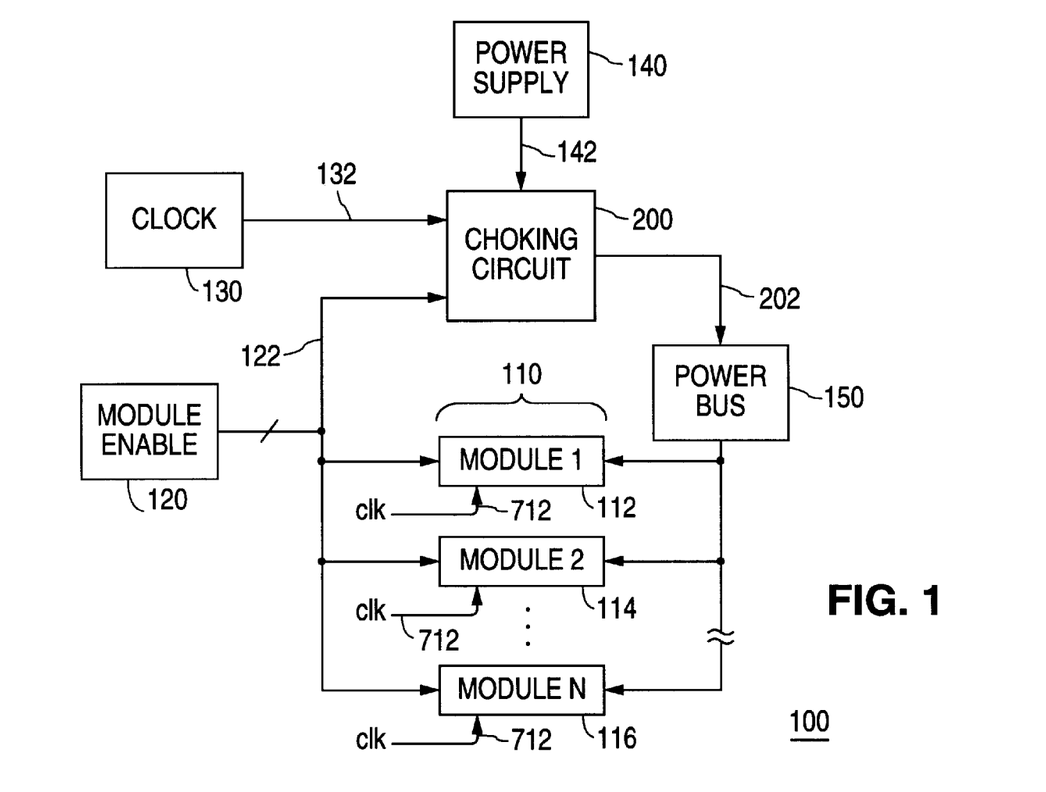
FIG. 1 is a block diagram of a circuit including a choking circuit according to the present invention.

FIG. 1 illustrates the elements that make up a circuit 100 to which the present invention may be applied. The circuit contains N modules 110. Modules 110 are discrete circuit elements which perform various functions of circuit 100. Module 112 may be, for example, a memory circuit. Module 114 may be, for example, a signal processing circuit. Module 116 may be, for example, a central processing unit. Because not all of modules 110 need to be active at the same time, the modules may be selectively activated by a module select signal 122 from module enable circuit 120.

Choking circuit 200 receives the module select signal 122, power on power supply line 142 from power supply 140, and clock signal 132 from clock generator 130. Choking circuit 200 generates choked power 202, which it supplies to power bus 150. Power bus 150 provides the choked power to modules 110.

Figure 2:
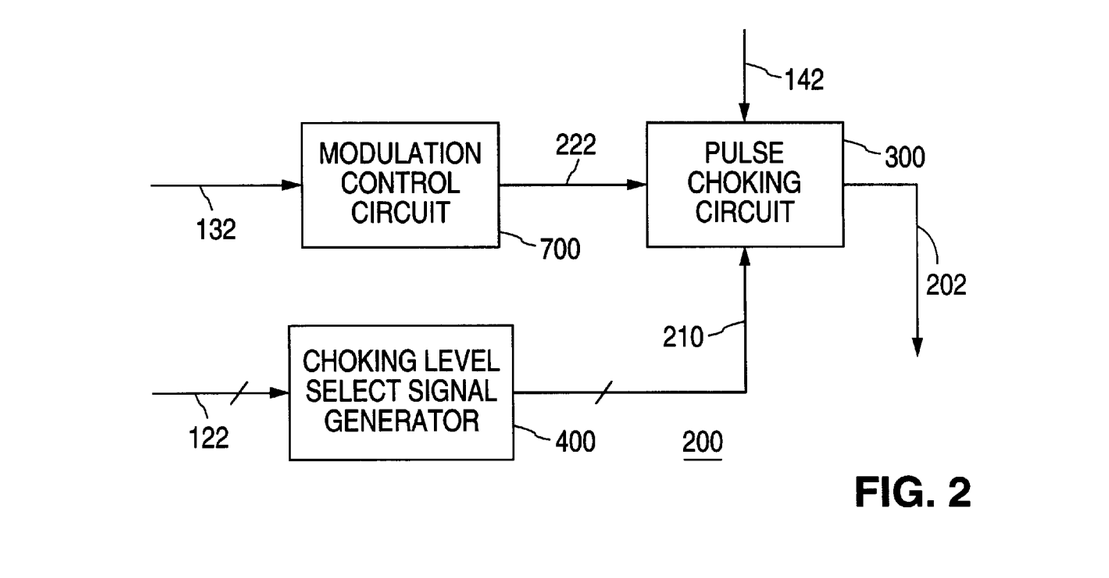
FIG. 2 is a block diagram of the choking circuit according to the present invention.

FIG. 2 illustrates the preferred elements of choking circuit 200. Choking level select signal generator 400 receives module select signal 122 and generates choking level select signal 210. Modulation control circuit 700 receives clock signal 132 and generates modulation control signal 222. Pulse choking circuit 300 receives power on power supply line 142, choking level select signal 210, and modulation control signal 222, and generates choked power 202.

Figure 3:
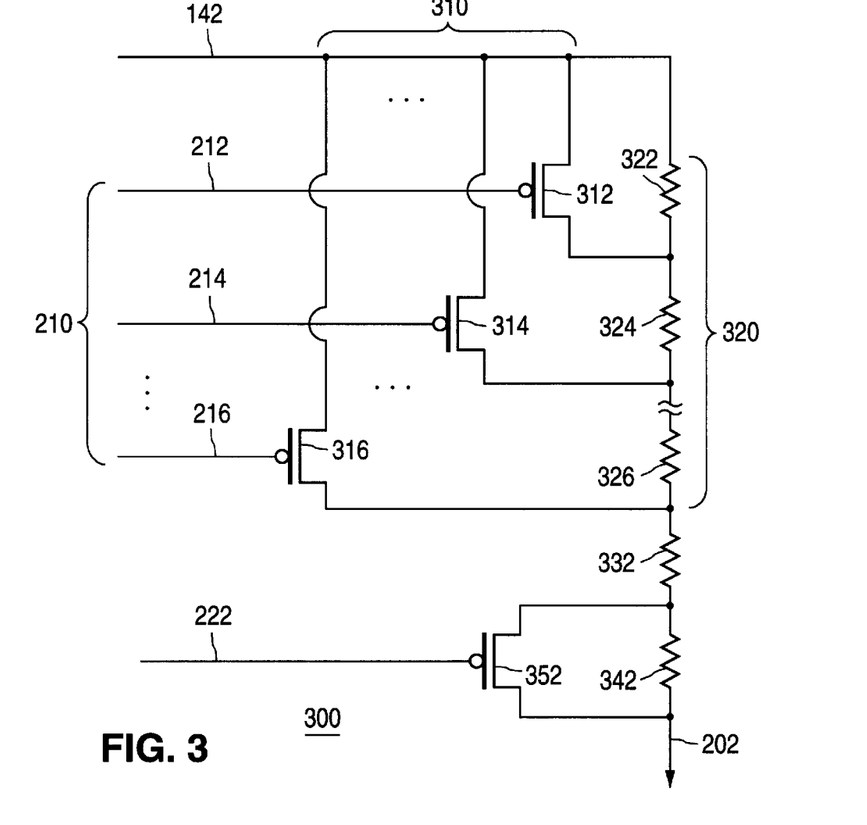
FIG. 3 is a schematic diagram of a pulse choking circuit with multiple choking levels in the choking circuit.

FIG. 3 illustrates a preferred embodiment of pulse choking circuit 300. Preferably, circuit 300 is an $I_{cc}$ current pulse choking circuit. Pulse choking circuit 300 comprises a resistor chain 320 in parallel with a number of transistors 310. Those skilled in the art will recognize that other components and configurations are possible.

Choking level select signal 210 comprises N level select signals corresponding to the N modules 110. Level select signal 212 controls transistor 312. Transistor 312 is connected to power supply line 142 in parallel with resistor 322.

Level select signal 214 controls transistor 314. Transistor 314 is connected to power supply line 142 in nested parallel with transistor 312 and resistors 322 and 324. Other level select signals, transistors, and resistors may be inserted with transistors 310 and resistor chain 320 as corresponding to the N modules 110.

Level select signal 216 controls transistor 316. Transistor 316 is connected to power supply line 142 in nested parallel with transistors 312 and 314, and resistors 322, 324, and 326 (and other components as may be inserted).

Transistors 310 are preferably PMOS transistors. The resistors in resistor chain 320 are selected such that, when a corresponding module is active, the resistor provides a desired choking level. In addition, the resistors in resistor chain 320 may be selected to provide a minimum voltage on power bus 150 required for proper operation of modules 110.

Resistor 332 is in series with transistors 310 and resistor chain 320. When all N modules 110 (see FIG. 1) are enabled, resistor chain 320 is shorted by transistor 316. Hence, resistor 332 determines the minimum choking level for use when all modules are enabled.

Modulation control signal 222 controls transistor 352, which is in parallel with resistor 342 and in series with resistor 332. When modulation control signal 222 turns off transistor 352, the resistance between power supply 140 and power bus 150 (see FIG. 1) reaches its maximum value as set by resistors 342, 332, and selected ones of resistor chain 320 which have not been bypassed by transistors 310. Modulation control signal 222 then gradually turns on transistor 352, and the resistance decreases without resistor 342. Preferably, modulation control signal 222 turns off transistor 352 at every clock edge, and signal 222 gradually turns on transistor 352 such that the resistance decreases within a half clock cycle.

The circuit of FIG. 3 operates as follows. Power supply line 142 provides power from power supply 140. Choking level select signal 210 activates one or more of transistors 310. When all level select signals 210 are high, preferably right at every clock edge, the maximum resistance during resistance modulation is the sum of resistors 322, 324, 326, 332, and 342, which corresponds to the heaviest choking level for a low activity case of an integrated circuit. Then, modulation control signal 222 gradually turns on transistor 352, and the resistance is gradually modulated to the sum of resistors 322, 324, 326, and 332. When level select signal 216 is low, preferably right at every clock edge, the maximum resistance during resistance modulation is the sum of resistors 332 and 342, which corresponds to the lightest choking level for a high activity case of an integrated circuit. When modulation control signal 222 gradually turns on transistor 352, the resistance is gradually modulated to that of resistor 332.

Figure 4:
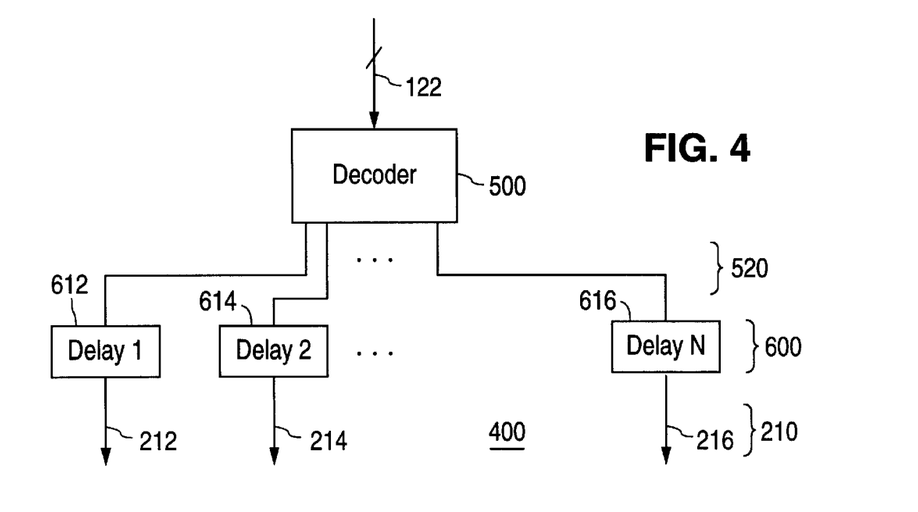
FIG. 4 is a block diagram of a choking level select signal generator in the choking circuit.

In reality, choking level select signal 216 is delayed with respect to clock signal 132 by delay element 612 and decoder 500 (see FIG. 4). Modulation control signal 222 is delayed with respect to clock signal 132 by modulation control circuit 700 (see FIG. 2). Modules 110 begin to draw a pulse of $I_{cc}$ current on delayed clock signal 712 (see FIGS. 1 and 7A), which is delayed from clock signal 132 by the clock driver and the clock tree distribution system. Thus, there are three delays which must be addressed.

Most preferably, circuit 100 is designed such that these three delays are approximately equal. If this is not possible, the next preferable design is for the choking level to still be high at the edge of delayed clock signal 712. This results in less of a glitch in $I_{cc}$ than if the choking level were low. One way of keeping the level high is by gradually reducing level select signal 212 (see FIG. 6B). Before implementation, these delay issues may be addressed by simulation of circuit 100 for the smoothest (i.e., lowest amplitude high frequency harmonics) $I_{cc}$ current from power supply 140 (see FIG. 1).

Referring back to FIG. 3, this resistance in association with the parasitic capacitance provided by the modules forms a low-pass filter network. During the switching of the logic elements of modules 110, this filter network removes the high frequency harmonics caused by the transient switching current. In this manner, transient current from power supply 140 is reduced in magnitude and harmonic composition and is not correspondingly radiated into space by power bus 150, thereby reducing electromagnetic emissions.

FIG. 4 illustrates the preferred elements of choking level select signal generator 400. Choking level select signal generator 400 comprises a decoder 500 and delay network 600.

Decoder 500 receives module select signal 122 and generates N outputs 520, corresponding to the N modules 110. Delay network 600 receives outputs 520 and generates choking level select signal 210.

Delay elements 600 comprise N delay elements 612, 614, and 616 which receive outputs 520 and generate level select signals 212, 214, and 216, respectively.

Figure 5:
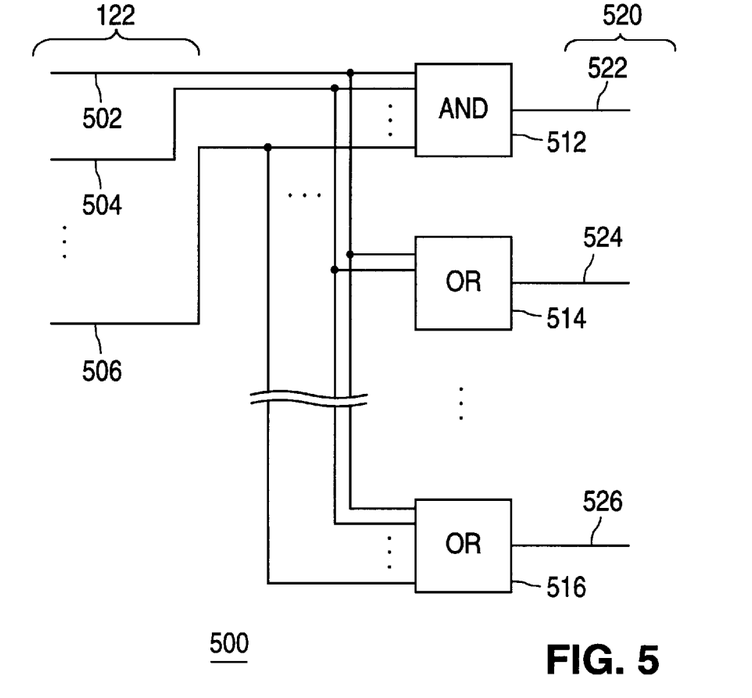
FIG. 5 is a block diagram of a decoder in the choking level select signal generator.

FIG. 5 illustrates a preferred embodiment of decoder 500. Module select signal 122 is comprised of N module select signals 502, 504, and 506, corresponding to the N modules 110. Module select signals 502, 504, and 506 are received by AND gate 512 and N-1 OR gates 514 and 516, corresponding to the N modules 110. Gates 512, 514, and 516 generate outputs 520, comprising output signals 522, 524, and 526, respectively.

Figure 6A:
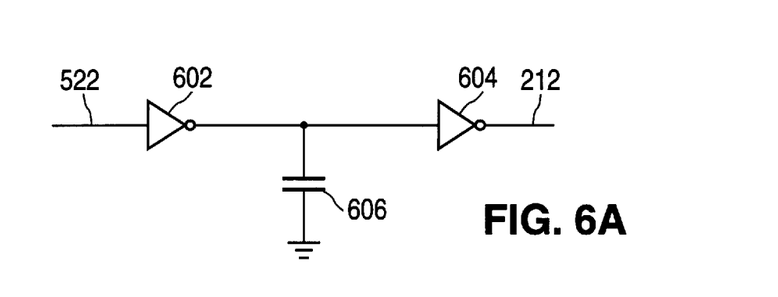
FIG. 6A is a schematic diagram of a delay element in the choking level select signal generator.

FIG. 6A illustrates a preferred embodiment of delay elements 600. Delay element 612 comprises a first inverter 602, a second inverter 604, and a capacitor 606.

Figure 6B:
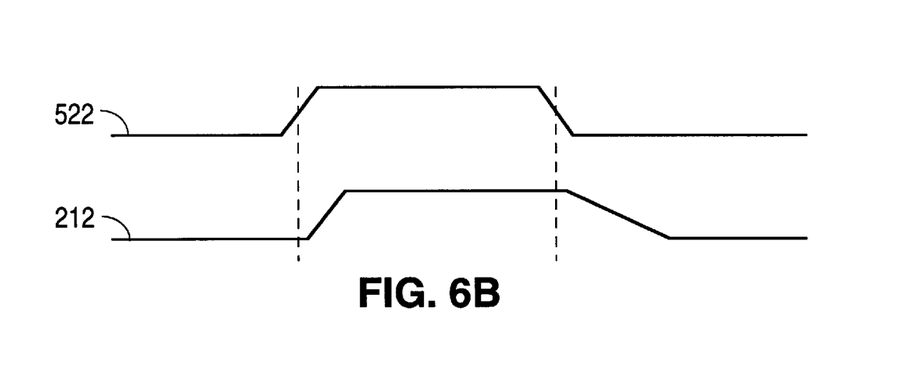
FIG. 6B is a waveform diagram illustrating signals from FIG. 6A.

As shown in FIG. 6B, inverters 602 and 604 and capacitor 606 are selected such that a fall time of level select signal 212 is greater than a rise time of level select signal 212 and greater than rise and fall times of output signal 522.

Figure 7A:
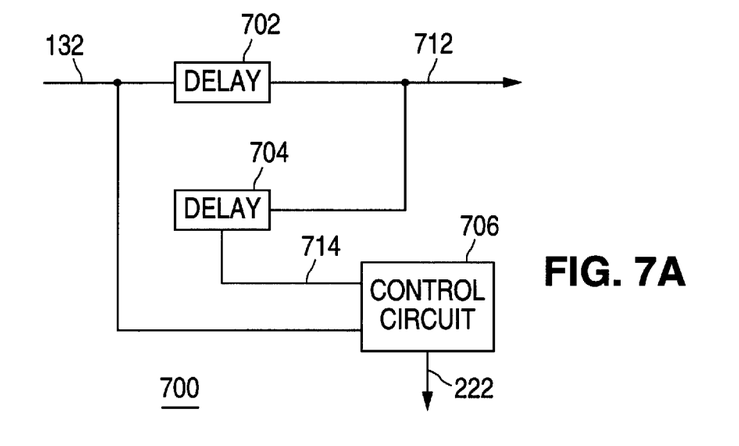
FIG. 7A is a block diagram of a modulation control circuit in the choking circuit.

FIG. 7A illustrates the preferred elements of modulation control circuit 700. Modulation control circuit 700 comprises a first delay element 702, a second delay element 704, and a control circuit 706. In a preferred embodiment, this circuit is implemented similarly to circuit 26 in U.S. Pat. No. 5,317,207.

First delay element 702 receives clock signal 132 and generates delayed clock signal 712, which is also inverted. Delayed clock signal 712 is provided to modules 110 (see FIG. 1). Second delay element 704 receives delayed clock signal 712 and generates further-delayed clock signal 714. Second delay element 704 also inverts signal 714. Control circuit 706 receives further-delayed clock signal 714 and clock signal 132, and generates modulation control signal 222.

Figure 7B:
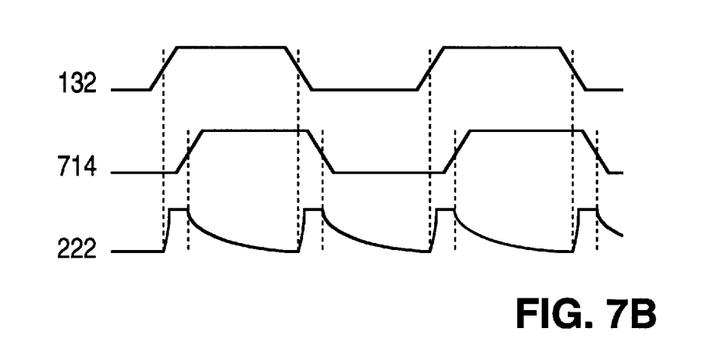
FIG. 7B is a waveform diagram illustrating signals from FIG. 7A.

FIG. 7B shows the correspondence between the signals 132, 714, and 222 generated by the circuit shown in FIG. 7A. Modulation control signal 222 rises at a switching threshold of clock signal 132 rising or falling. Modulation control signal 222 gradually falls at a switching threshold of further-delayed clock signal 714 rising or falling. In this manner, modulation control signal 222 falls gradually after further-delayed clock signal 714 toggles and reaches a low level before the next clock edge. Modulation control signal 222 then provides control of pulse choking circuit 300 as shown in FIG. 3.

Specific Implementation of the Preferred Embodiments

One application of this $I_{cc}$ current EMI choke with multiple choking levels is Cop8sgr7, a system-on-chip integrated circuit with a Cop8 microcontroller core and a 32K EPROM, manufactured by National Semiconductor Corp. of Santa Clara, Calif. The Cop8sgr7 may be modularized into two modules, with one module being the Cop8 microcontroller core and another module being the 32K EPROM. For these two modules, two choking levels were chosen for this integrated circuit.

Within 20 time states (t0, t1, t2, . . . , t19) of an instruction cycle, both the Cop8 microcontroller core and the 32K EPROM are active in states t19 to t3, and a lower choking level was chosen in these states. Only the Cop8 microcontroller core is active in states t4 to t18, and a higher choking level was chosen in these states. In this way, the electromagnetic emissions have been shown by simulation to be reduced by about 5 dB compared to the choke device with a single choking level as disclosed in U.S. Pat. No. 5,317,207, and the Cop8sgr7 can operate at a power supply voltage down to 2.6 volts.

Specifically, the minimum power required by the Cop8sgr EPROM is 2.45 V. Using the single-level choke, the voltage on the power bus would drop to 2.3 V, resulting in a malfunction in the EPROM. Using the dual-level choke maintains the minimum voltage above 2.5 V.

Computer Simulation Results

Two circuits were simulated to illustrate the differences between the present invention and the subject matter disclosed in U.S. Pat. No. 5,317,207. The first simulated circuit was the Cop8sgr7 with the single-level choke of the '207 patent. The second simulated circuit was the Cop8sgr7, modularized as above, with the multilevel choke of the present invention configured into two choking levels.

The following parameters were provided to the computer simulation for both circuits:

$I_{cc(max)}$=7 mA (at $V_{cc}$=5.5 V, T=−55° C.)

Frequency=10 MHz $V_{cc(min)}$>0.82 * $V_{cc}$ (4.51 V at $V_{cc}$=5.5 V)

10% of nodes change state at each clock edge
20 time cycles
Cop8 microcontroller active at all time cycles
EPROM active at cycles t19 to t3

Figure 8:
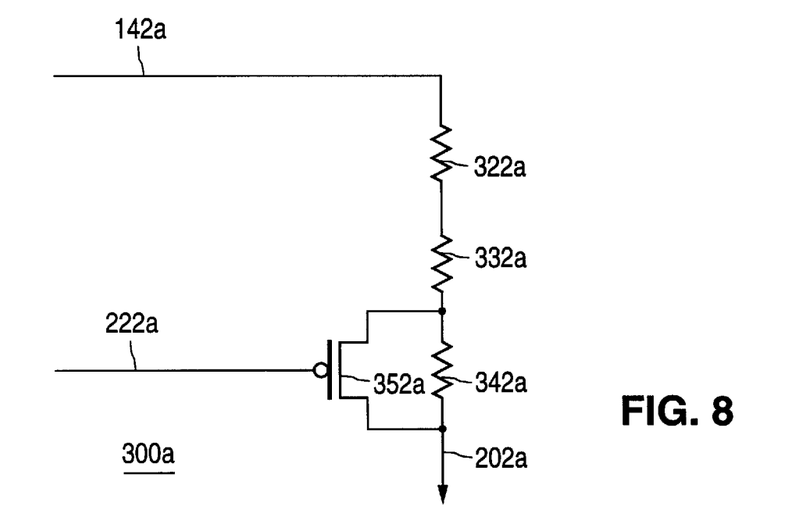
FIG. 8 is a schematic diagram of a pulse choking circuit in a first simulated circuit.

FIG. 8 shows a circuit diagram for a pulse choking circuit 300a in the first simulated circuit. Power line 142a and modulation control signal 222a correspond to similar features in FIG. 3. Resistors 322a, 332a, and 342a have resistances of 60 Ω, 0 Ω, and 100 Ω, respectively. Transistor 352a has a width/length ratio of 300/0.6.

Figure 9A:
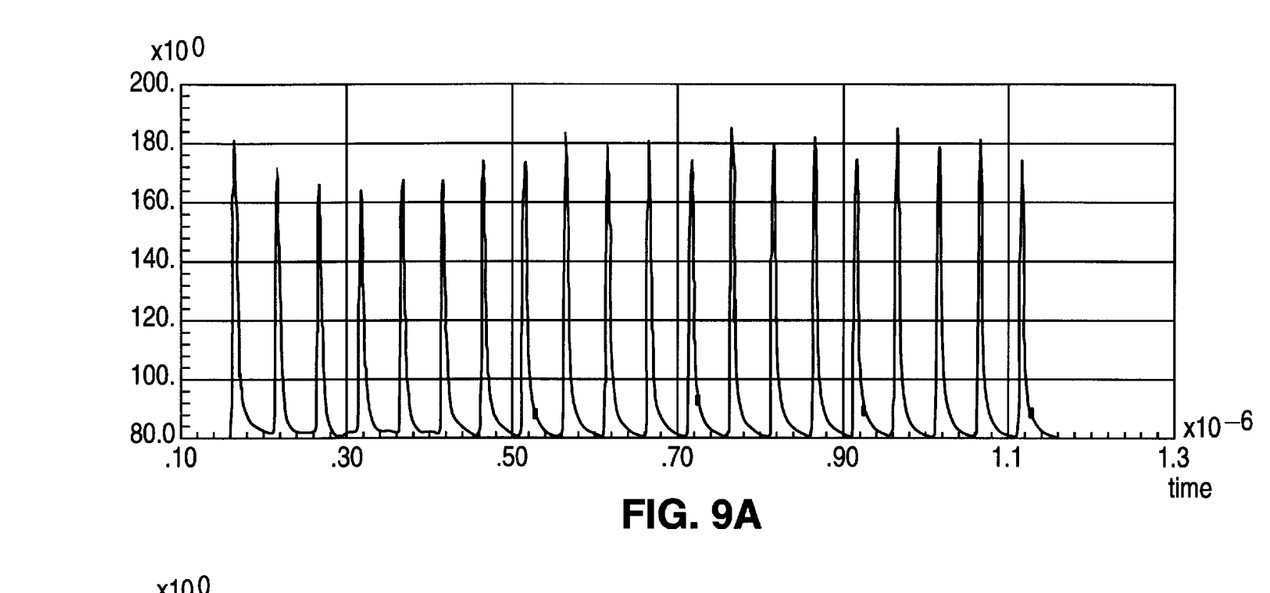
FIGS. 9A–9B are waveform diagrams illustrating resistance and voltage signals from FIG. 8.
Figure 9B:
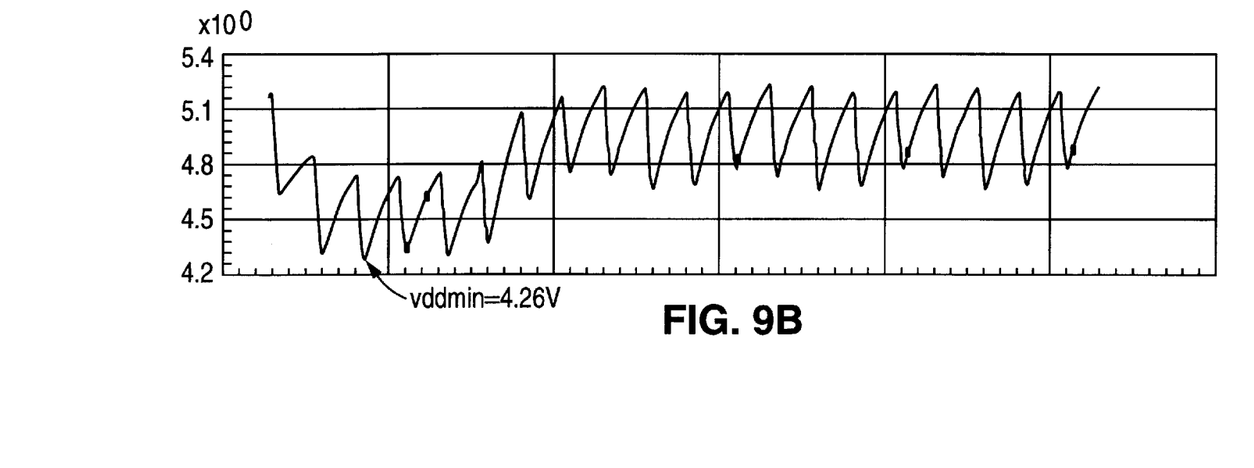

FIGS. 9A–9B show various waveforms relating to the circuit of FIG. 8. FIG. 9A shows the resistance generated by circuit 300a over 20 time cycles. FIG. 9B shows the voltage supplied to the power bus by circuit 300a over the same time period.

FIG. 9A shows that the resistance varies between about 80 Ω and about 180 Ω each time cycle. FIG. 9B shows that the voltage supplied to the power bus varies between about 4.3 V and about 4.7 V during time cycles t19 through t3, and between about 4.7 V and about 5.2 V during the other time cycles. This voltage variation results from the activity of the EPROM.

Figure 10:
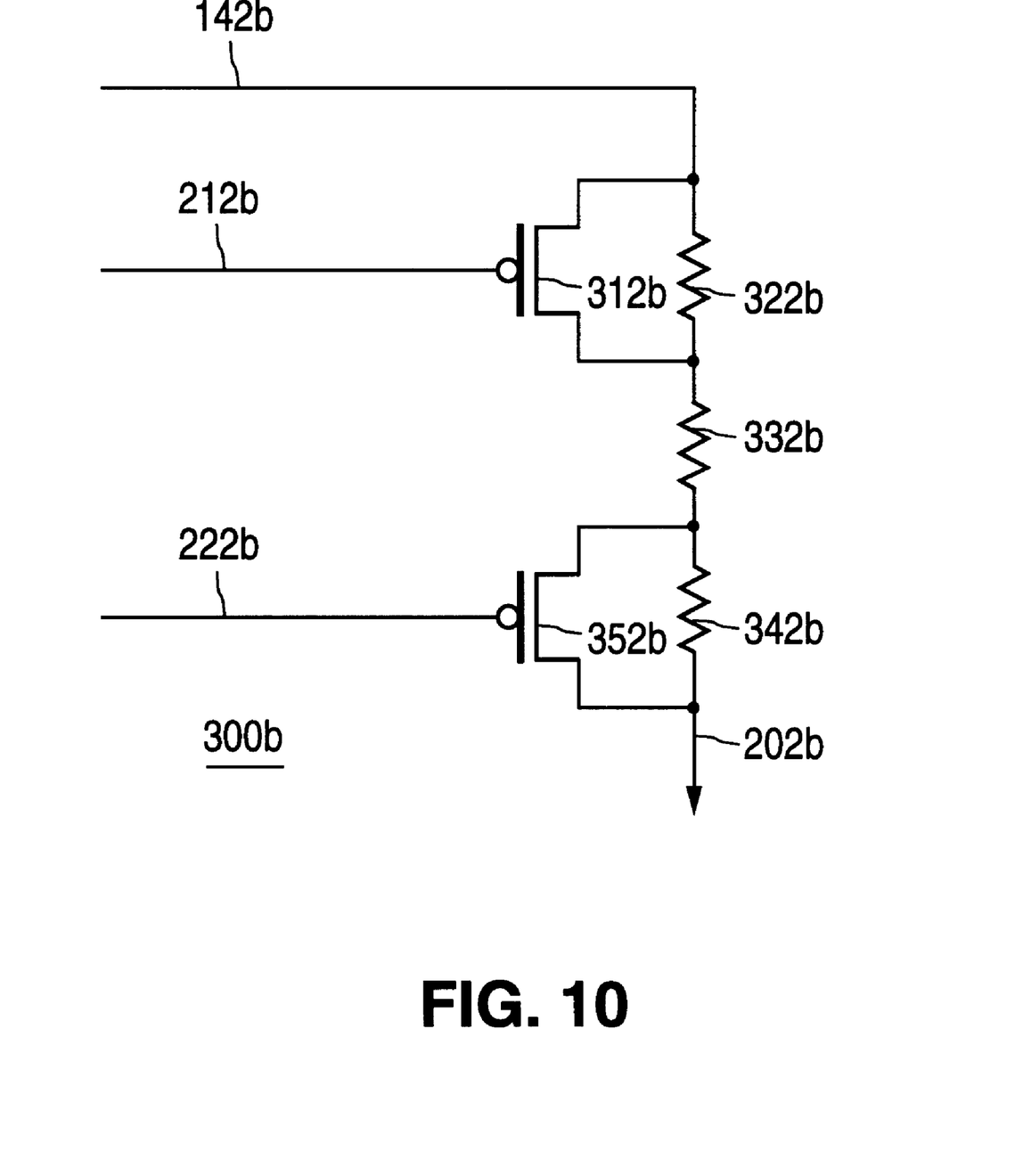
FIG. 10 is a schematic diagram of a pulse choking circuit in a second simulated circuit.

FIG. 10 shows a circuit diagram for a pulse choking circuit 300b in the second simulated circuit. Power line 142b, modulation control signal 222b, level select signal 212b, and transistor 312b correspond to similar features in FIG. 3. Resistors 322b, 332b, and 342b have resistances of 60 Ω, 0 Ω, and 100 Ω, respectively. Transistor 352b has a width/length ratio of 300/0.6. These are the same values as those used in FIG. 8.

Figure 11A:
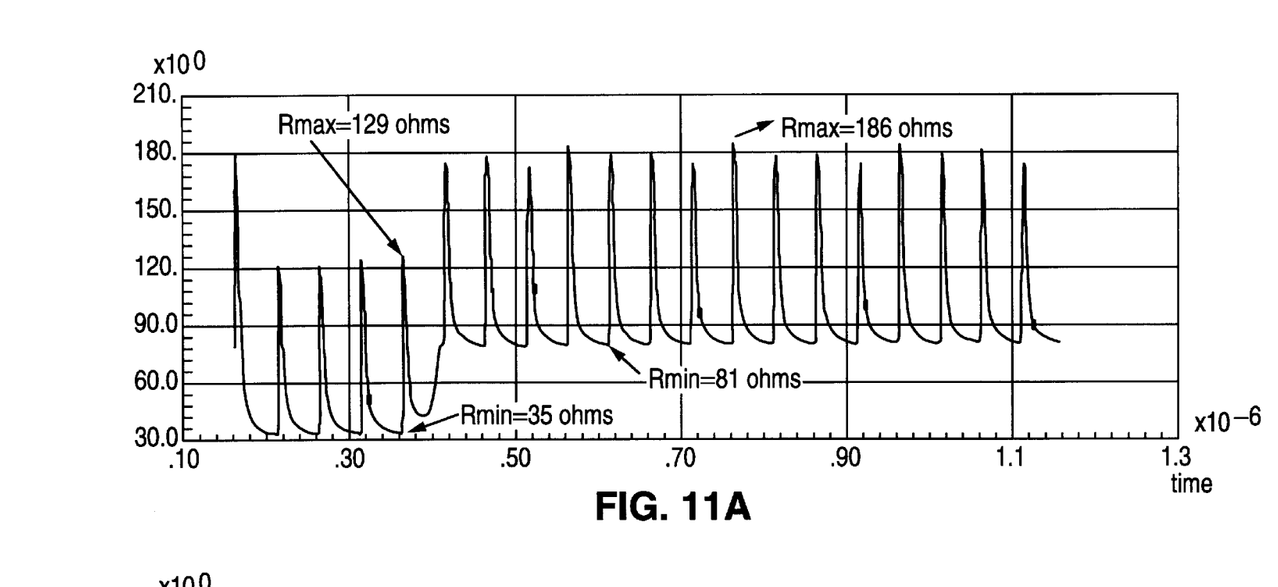
FIGS. 11A–11B are waveform diagrams illustrating resistance and voltage signals from FIG. 10.
Figure 11B:
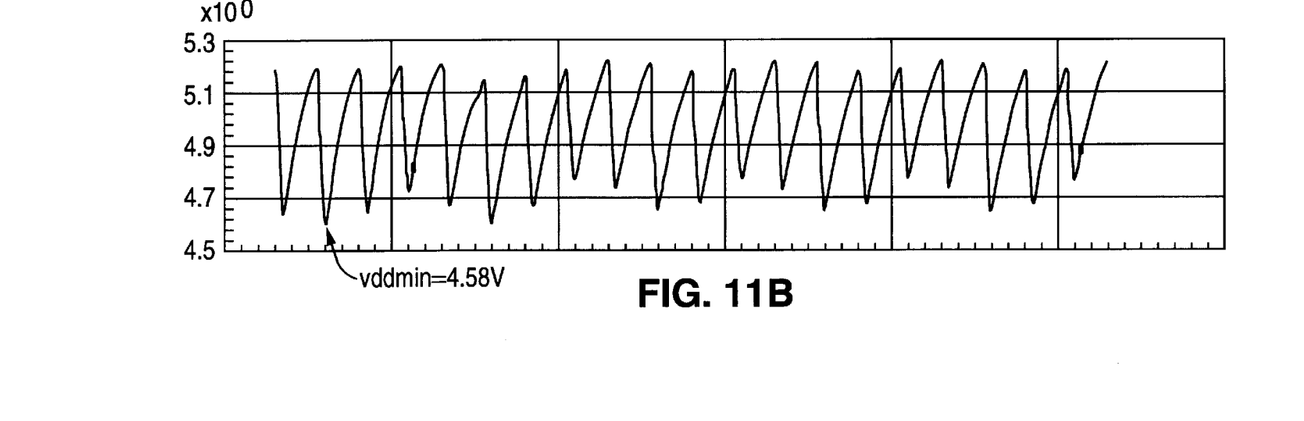

FIGS. 11A–11B show various waveforms relating to the circuit of FIG. 10. FIG. 11A shows the resistance generated by circuit 300b over 20 time cycles. FIG. 11B shows the voltage supplied to the power bus by circuit 300b over the same time period.

FIG. 11A shows that the resistance varies between about 35 Ω and about 130 Ω during time cycles t19 through t3, and between about 80 Ω and about 185 Ω during the other time cycles. FIG. 11B shows that the voltage supplied to the power bus varies between about 4.6 V and about 5.2 V for all time cycles. This constant voltage variation results from the decreased resistance when the EPROM is active.

These simulation results illustrate the advantages of the present invention over the single-level choke of the '207 patent. For a given level of EMI emissions, the voltage supplied to the power bus drops down 23% of the external power supply voltage when using the single-level choke. Such a drop could cause a malfunction in the integrated circuit. The voltage drops down only 16% for the multilevel choke of the present invention. Thus, to guarantee a given voltage level on the power bus, the single level choke would be required to perform less choking, which increases EMI. The multilevel choke of the present invention does not need to make this trade-off between voltage drop and EMI performance.

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus including a choking circuit for reducing electromagnetic interference, comprising:
    a choking level select signal generator configured to receive a module select signal corresponding to selective activation of a plurality of modules powered by a power bus within an integrated circuit, and to generate a choking level select signal corresponding to said module select signal;
    a pulse choking circuit, connected to said choking level select signal generator, said pulse choking circuit configured to receive said choking level select signal and, said pulse choking circuit configured to selectively generate, on said power bus, choked power corresponding to said choking level select signal, when indicated by a modulation control signal; and
    a modulation control circuit, connected to said pulse choking circuit, configured to receive a clock signal and to generate said modulation control signal corresponding to said clock signal.

2. The apparatus of claim 1, wherein said module select signal comprises:
    a plurality of signals, each corresponding to one of said plurality of modules.

3. The apparatus of claim 1, wherein said choking level select signal generator comprises:
    a decoder circuit configured to receive said module select signal and to generate an output signal corresponding to said module select signal; and
    a plurality of delay circuits, connected to said decoder circuit, configured to receive said output signal and to generate said choking level select signal corresponding to said output signal,
    wherein said choking level select signal includes a plurality of select subsignals corresponding to said plurality of delay circuits, each of said plurality of select subsignals having pluralities of rising and falling edges with associated rise times and fall times, respectively,
    wherein said plurality of delay circuits are configured such that, for each of said plurality of select subsignals, said rise times differ from said fall times.

4. The apparatus of claim 3, wherein said output signal includes a plurality of output subsignals, wherein said plurality of delay circuits each comprise:
    a first delay element configured to receive one of said plurality of output subsignals and to generate an intermediate output;
    a second delay element, connected to said first delay element, configured to receive said intermediate output and to generate one of said plurality of select subsignals; and
    a shunting capacitance element between said first and second delay elements, having a capacitance such that said rise times are less than said fall times.

5. The apparatus of claim 1, wherein said pulse choking circuit comprises:
    a plurality of resistors connected in series between a power source and said power bus; and
    a plurality of transistors connected in a selectively parallel arrangement with said plurality of resistors, said plurality of transistors configured to receive said choking level select signal.

6. The apparatus of claim 5, wherein said choking level select signal comprises:
    a plurality of select subsignals each provided to one of said plurality of transistors.

7. The apparatus of claim 1, wherein said modulation control circuit comprises:
    a first delay element, configured to receive said clock signal and to generate a delayed clock signal;
    a second delay element, connected to said first delay element, configured to receive said delayed clock signal and to generate a further-delayed clock signal; and a control circuit, connected to said second delay element, configured to receive said clock signal and said further-delayed clock signal, and to generate said modulation control signal corresponding to said clock signal and said further-delayed clock signal.

8. A method of reducing electromagnetic interference, comprising the steps of:

receiving a module select signal corresponding to selective activation of a plurality of modules powered by a power bus within an integrated circuit;

generating a choking level select signal corresponding to said module select signal;

receiving said choking level select signal and a clock signal;

generating a modulation control signal corresponding to said clock signal;

receiving said modulation control signal; and generating, on a power bus, choked power corresponding to said choking level select signal, when indicated by said modulation control signal.

9. The method of claim 8, wherein said step of receiving a module select signal comprises the step of:

receiving a plurality of signals corresponding to selective activation of said plurality of modules.

10. The method of claim 8, wherein said step of generating a choking level select signal comprises the steps of:

generating an output signal corresponding to said module select signal;

receiving said output signal; and generating a plurality of select subsignals corresponding to said output signal, each of said plurality of select subsignals having pluralities of rising and falling edges with associated rise times and fall times, respectively, wherein for each of said plurality of select subsignals, said rise times differ from said fall times.

11. The method of claim 10, wherein:

said step of generating an output signal comprises the step of generating a plurality of output subsignals corresponding to said module select signal; and said step of generating a plurality of select subsignals comprises the steps of:
(1) generating a plurality of intermediate outputs corresponding to said plurality of output subsignals,
(2) modifying each of said plurality of intermediate outputs such that for each intermediate output, said rise times are less than said fall times, and
(3) generating each of said plurality of select subsignals based on each intermediate output.

12. The method of claim 8, wherein:

said step of generating a choking level select signal comprises the step of generating a plurality of select subsignals corresponding to said module select signal;

said step of receiving said choking level select signal comprises the step of receiving said plurality of select subsignals; and said step of generating choked power comprises the step of generating, on said power bus, choked power corresponding to said plurality of select subsignals, when indicated by said modulation control signal.

13. The method of claim 8, wherein said step of generating a modulation control signal comprises the steps of:

receiving said clock signal;

generating a delayed clock signal corresponding to said clock signal;

receiving said delayed clock signal;

generating a further-delayed clock signal corresponding to said delayed clock signal;

receiving said further-delayed clock signal; and generating said modulation control signal corresponding to said clock signal and said further-delayed clock signal.

* * * * *